United States Patent [19]

Caprari

[11] Patent Number: 5,703,374
[45] Date of Patent: Dec. 30, 1997

[54] TELECENTRIC NUV-DUV IRRADIATOR FOR OUT-OF-CONTACT EXPOSURE OF LARGE SUBSTRATES

[75] Inventor: Fausto Caprari, East Brunswick, N.J.

[73] Assignee: Actinic Systems, Inc., East Brunswick, N.J.

[21] Appl. No.: 694,107

[22] Filed: Aug. 8, 1996

[51] Int. Cl.$^6$ .................................................. G21K 5/04
[52] U.S. Cl. ........................... 250/492.2; 353/102; 355/67
[58] Field of Search .......................... 250/492.2, 493.1, 250/504 R, 505.1; 353/102; 355/67; 359/366

[56] References Cited

U.S. PATENT DOCUMENTS

| | | | |
|---|---|---|---|
| 3,860,335 | 1/1975 | Caprari | 353/102 |
| 4,023,904 | 5/1977 | Sheets | 250/492.2 |
| 4,348,105 | 9/1982 | Caprari | 355/67 |
| 4,707,609 | 11/1987 | Shimamura | 250/492.2 |
| 4,907,029 | 3/1990 | Caprari | 355/67 |

*Primary Examiner*—Kiet T. Nguyen
*Attorney, Agent, or Firm*—Plevy & Associates

[57] ABSTRACT

A condenser lens system is provided for forming an effective circular source of NUV-DUV radiation which is the telecentric stop of the system and is characterized by a short focal length and higher marginal irradiance to compensate for marginal cosine losses. The system utilizes a long arc medium/low pressure mercury lamp which is surrounded by a large paraboloidal reflector and is mounted below the focal point of the reflector to generate a converging radiation beam directed to the condenser lens system. The system then projects the effective circular source of NUV-DUV radiation to a lens system comprising two plano convex lenses to convert the effective circular source into a collimated beam for out-of-contact printing of large substrates. The highly collimated and spatially coherent beam can be used to irradiate a telecentric objective for projection exposure on wafer steppers or flood exposure systems.

30 Claims, 3 Drawing Sheets

TELECENTRIC NUV-DUV IRRADIATOR FOR OUT-OF-CONTACT EXPOSURE OF LARGE SUBSTRATES

FIELD OF THE INVENTION

The present invention relates to an optical system for providing an effective circular source of near and deep ultraviolet (NUV-DUV) radiation and more particularly to an apparatus for providing a uniform NUV-DUV radiant source for out-of-contact exposure of large substrates.

BACKGROUND OF THE INVENTION

In the field of optical exposure systems of the type employed for exposing photoresist material, as deposited on wafers in the production of integrated circuits, the mask may be positioned in close proximity to the wafer at a lens exposure plane. At that plane one desires that the radiation impinging upon the plane is characterized by a relatively uniform field. Such systems, well known in the art, are disclosed in U.S. Pat. No. 4,348,105, entitled "Radiation Shadow projection Exposure System", issued on Sep. 7, 1982, and U.S. Pat. No. 3,860,335, entitled "Optical system", issued on Jan. 14, 1975, each issued to Fausto Caprari and assigned to the RCA Corporation.

Essentially, these prior art systems disclose radiation systems for projecting uniform fields of irradiation to expose a photomask through a transparency in proximity to or in contact with the irradiance sensitive surface, such as a wafer or another mask. The systems utilize different radiant sources which operate in the near and deep ultraviolet (DUV) wavelength spectrum for converting such radiant sources into a suitable pattern which is projected on a plane containing a mask and a photoresist coated wafer. The patents describe different radiant sources which operate in the near and deep ultraviolet wavelength spectrum and various techniques for converting such sources into a suitable pattern which is projected onto a plane containing a mask and a photoresist wafer.

It is understood, that as integrated circuits become more complex and operate at higher and higher frequencies, greater resolution regarding such photoresistive exposure systems is desired to be able to distinguish between printing feature sizes on the order of 1 micrometer or less which are a function of the resist process used.

The above noted prior art investigated the use of deep ultraviolet (DUV) lithography employing ultraviolet radiation in the range of 200 to 300 nanometers for printing feature sizes on the order of 1 micron or less. The photoresist exposure systems in the prior art employed a pin-point radiant source, a specular ellipsoidal reflector, Fly eye lens system and collimation lenses or a helical pulse xenon source in a radiation projection optical system which included three or four plano convex lenses. In these types of systems, the asymmetry, non-uniformity, and spatial instability of the pin-point radiant source results in non-uniformity of the ray bundles with respect to the angular distribution across the wafers.

Tests indicated that very uniform ray bundle distribution across the wafer was required to resolve submicron lines and spaces across the photoresist. At that time, commercially available radiant sources were not symmetrical, uniform or spatially stable. Pursuant to the goal of improved uniformity in the ray bundle, a superior radiant source was developed and disclosed in U.S. Pat. No. 4,907,029, entitled "Uniform Deep Ultraviolet Radiant Source For Sub Micron Resolution Systems", issued on Mar. 6, 1990 to Fausto Caprari and assigned to Actinic Systems, Inc.

Caprari '029 discloses an optical system utilizing an elongated medium/low pressure mercury lamp surrounded by a large, lightly diffused ellipsoidal reflector in conjunction with a condenser lens assembly, entrance pupil lens and collimation lens. The lamp source disclosed is a medium/low pressure mercury lamp source, the type utilized for street illumination, characterized by high DUV spectral emissions at a peak of 253.7 nanometers in wavelength. The optical system converts the highly unsymmetrical and unstable radiation from the lamp source into an efficient radiation pattern which is ultra stable and usable for submicron resolution in photolithographic systems. The lamp employed operates to convert approximately 5% of its input energy or power to emissions within the DUV range between 200–300 nanometers. The coherency factor, which is spatial rather than temporal, for that particular optical system is 0.24, implying that the radiant source is 76% coherent.

The optical system disclosed in Caprari '029 has proved useful for field sizes up to five inches in diameter for submicron resolution photolithography in contact printing of deep ultraviolet (DUV) photoresist coated silicon or gallium arsenide wafers. However, current emphasis in the art is for the exposure of eight inch (8") wafers, twelve inch (12") wafers, and flat panel displays up to twenty four inches (24") in diameter in out-of-contact printing mode.

The present invention meets the requirements for the larger diameter substrates, through the use of a long arc mercury lamp of improved uniformity and symmetry which is mounted below the focal point of a paraboloidal reflector. This combination results in a convergent beam which is characterized by higher marginal irradiance to compensate for marginal cosine losses. Thus, a paraboloidal reflector which was designed to generate a collimated beam from a compact arc source is used to generate a convergent beam from a long arc source. The use of a long arc source is essential in view of its low operating pressure, which results in a marked increase of DUV radiation and improved emission uniformity. The design of the condenser lens system in the present invention was optimized to focus the convergent beam into an effective circular source which becomes the telecentric stop of the system for improved collimation uniformity. A dual filter assembly was added between the effective circular source and the entrance pupil lens to reduce chromatic aberration for further collimation improvement.

Thus, the lightly diffused ellipsoidal reflector taught in the '029 patent is replaced by the present invention with a commercial paraboloidal reflector and the rest of the optical system is improved for telecentric radiation. True telecentric radiation, in conjunction with high spatial coherency, results in excellent critical dimension (CD) control and very high image contrast in a photoresist exposure.

It is therefore an object of the present invention to provide a telecentric NUV-DUV irradiator for improved out-of-contact exposure of large substrates.

SUMMARY OF THE INVENTION

The present apparatus includes a mercury lamp emitting ultraviolet radiation which is collected by a paraboloidal reflector surrounding the mercury lamp and reradiating the ultraviolet radiation as a converging ray bundle. In a preferred embodiment the mercury lamp is pressurized between 0.5 to 5.0 atmospheres and operative to support an elongated arc having a length to width ratio greater than 2, and emit ultraviolet radiation in the spectral region between 185–440 nanometers.

A condenser lens assembly collects and converts the converging ray bundle to an effective circular source of small diameter which is the telecentric stop of the apparatus. The effective circular source is directed through an entrance pupil lens operative to provide an enlarged version of the effective circular source which in turn is directed through a collimation lens operative to provide a collimated beam. The collimated beam is directed to an out-of-contact mask and wafer at an intended plane distal from the mercury lamp.

BRIEF DESCRIPTION OF THE DRAWINGS

The invention will be better understood with reference to the following illustrative and non-limiting drawings, wherein like references are made to like elements or components, in which.

DETAILED DESCRIPTION OF THE INVENTION

Figure 1:
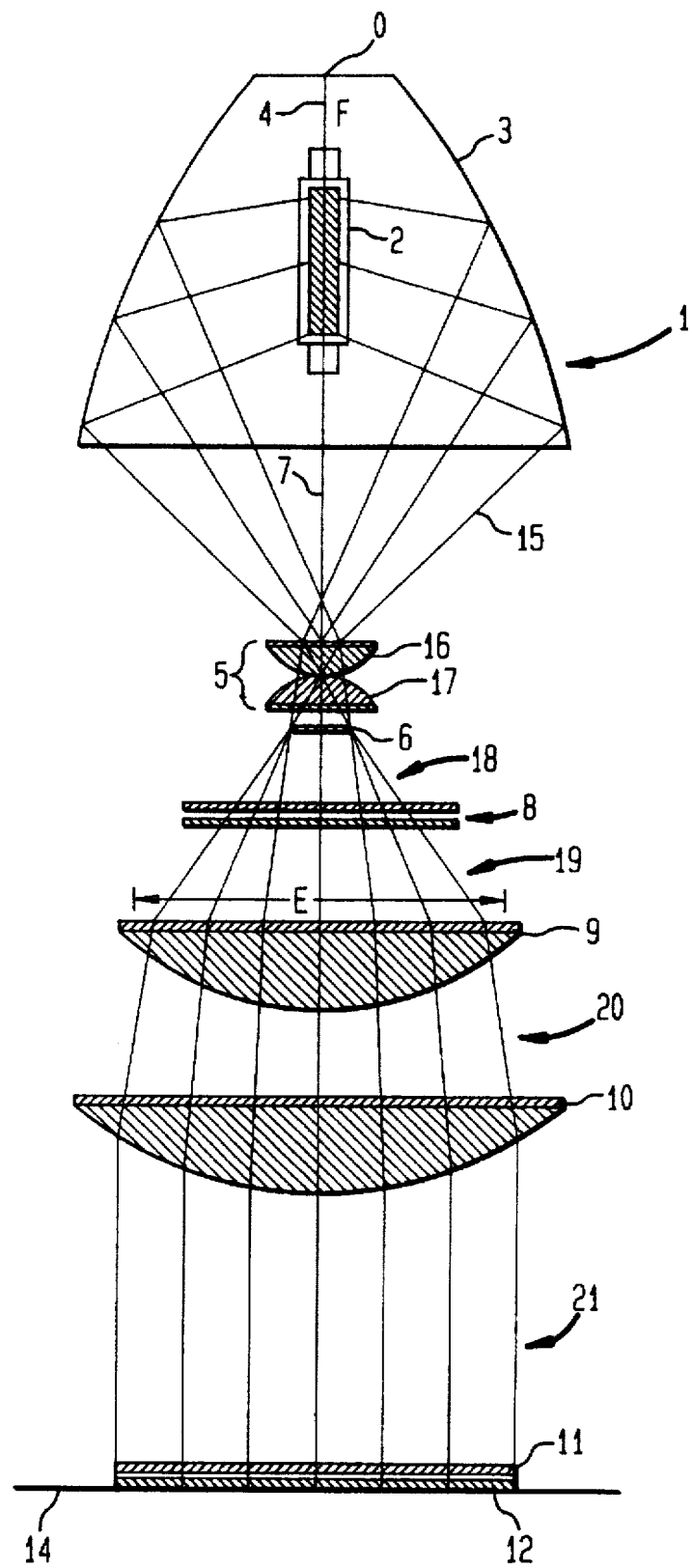
FIG. 1 is a schematic of a telecentric NUV-DUV irradiator for out-of-contact exposure of large substrates in accordance with the present invention.

As noted above, the prior art discloses an optical system that has proved useful for field sizes up to five inches in diameter for submicron resolution photolithography in contact printing of deep ultraviolet (DUV) photoresist coated silicon or gallium arsenide wafers. Currently, the emphasis in the art is for the exposure of eight inch (8") wafers, twelve inch (12") wafers, and flat panel displays up to twenty four inches (24") in diameter in out-of-contact printing mode. The present invention meets the requirements for the larger diameter substrates, through the use of a long arc mercury lamp 2 of improved uniformity and symmetry which is mounted below the focal point of a paraboloidal reflector 3. The present condenser lens system 5 is optimized to focus the convergent beam emanating from the paraboloidal reflector into an effective circular source 6 which becomes the telecentric stop of the system for improved collimation uniformity. A dual filter assembly 8 is added between the effective circular source and the entrance pupil lens 9 to reduce chromatic aberration for further collimation improvement.

Referring now to FIG. 1, there is shown a schematic of the present telecentric NUV-DUV irradiator 1 for out-of-contact exposure of large substrates. FIG. 1 is drawn at a scale of 4:1, wherein the dimensions in FIG. 1 are ¼ of the actual physical dimensions of the irradiator. Referring back to FIG. 1, there is depicted a medium/low pressure, long arc mercury lamp 2 which is a source of ultraviolet radiation. The long arc mercury lamp 2 is mounted symmetrically, by means of suitable hardware, along the optical axis 7 below the focal point (F) 4 of a paraboloidal reflector 3. As a result, a converging beam 15 is formed which is received by a condenser lens system 5, mounted along the optical axis 7, consisting of two identical short focal length plano convex lenses, 16 and 17, with their vertices in proximity to each other. As shown, the rays 15 collected by the condenser lens system 5 come to a focus near its rear focal plane generating an effective circular source 6 which is characterized by higher marginal irradiance to compensate for marginal cosine losses. The radiation pattern 18 from the effective circular source 6 is directed to an entrance pupil lens 9 and through a dual filter assembly 8, both mounted along the optical axis 7. The dual filter assembly 8 permits tuning the system to a chosen mercury resonance line for the elimination of chromatic aberration and consequent improvement in radiation pattern uniformity. The quasi monochromatic radiation bundle 19 is collected by the entrance pupil lens 9 and directed as a ray bundle 20 to a larger collimation lens 10, mounted along the optical axis 7, resulting in the formation of a large bundle 21 of collimated rays.

The combination of the entrance pupil lens 9 and the collimation lens 10 forms a projection lens with its principal focal plane located at the effective circular source 6 and all field forming rays must pass through this effective circular source 6. The effective circular source 6, thus, forms an effective aperture stop whether or not a mechanical diaphragm is placed there, but without any of the diffraction effects which a mechanical stop might cause. The effective aperture stop provided by the effective circular source 6 is referred to herein as a telecentric stop. The telecentric stop provided by the effective circular source improves the resultant collimation uniformity impinging on the mask/wafer plane 14.

Before explaining the detailed operation and physical structure of each of the above-described components of the present invention, it is indicated that the components are positioned as shown in FIG. 1 and supported with respect to the optical axis 7 in the alignment as shown in FIG. 1. The components, as for example the lens system and so on, are supported by typical mechanical means which should be obvious to those skilled in the art.

The lamp 2 is a medium/low pressure, long arc mercury lamp which provides a source of ultraviolet (NUV-DUV) radiation in the spectral region between 185-440 nanometers. The lamp contains mercury at a relatively low pressure in the range 0.5 to 5.0 atmospheres. The arc length of the lamp is 70 millimeters and the arc length to arc width ratio is greater than 2. The use of a long arc is essential in view of its low operating pressure, to provide a marked increase in DUV radiation and improved emission uniformity. The lamp 2 shown in FIG. 1 is a high precision source of radiation characterized by high symmetry and uniformity. A suitable lamp is available from Becky Technical Services (BTS), Berlin, N.J., under the product identification "1500 Mercury Arc Lamp". The lamp 2 from BTS converts the input power applied to it to ultraviolet radiation in the spectral region between 200-440 nanometers. BTS manufactures the complete system and supplies the associated components.

Preferably, the inner surface of the paraboloidal reflector 3 is coated to provide a mirror like reflectivity of ultraviolet radiation in the range from 185 to 440 nanometers wavelength. Thus, the inner surface of the reflector 3 reradiates the UV energy emitted by the lamp and becomes a second source of radiation. The inner surface of the paraboloidal reflector 3 has a parabolic cross-sectional profile governed by the formulaic relationship $y^2 = 4fX$, wherein f is the focal point below the origin O, X is the distance along the optical axis 7 from the origin O, and Y is a distance perpendicular to the optical axis 7 from the corresponding point X to the inner surface of the reflector 3. For the preferred embodiment shown in FIG. 1, the paraboloidal reflector has a focal point at 0.75 inches, and an outermost diameter of 9.6 inches (2Y) corresponding to a distance X of 7.45 inches. Thus, the lightly diffused ellipsoidal reflector taught in the '029 patent is replaced by the present invention with a commercial paraboloidal reflector and the rest of the optical system 1 is improved for telecentric radiation. True telecentric radiation, in conjunction with high spatial coherency, results in excellent critical dimension (CD) control and very high image contrast in photoresist exposure.

As shown by the ray trace lines 15, the NUV-DUV radiation emitted from the lamp 2 is reradiated by the reflector 3 as a converging beam which is received by the condenser lens system 5. The condenser lens system 5 is an assembly of two identical short focal length plano convex lenses, 16 and 17, with their vertices in proximity to each other, which increase collection efficiency and reduce spherical aberration. Preferably, for the irradiator 1 of FIG. 1, lenses 16 and 17 are each quartz lenses with a lens diameter of 2 inches, a radius of curvature of 1.150 inches, and a refractive index of 1.4745. As shown by ray tracing in FIG. 1, the ray bundle 15 collected by the condenser lens assembly 5 is focused near its focal plane to an effective circular source 6 which is characterized by higher marginal irradiance than at its center to compensate for cosine losses. The condenser lens assembly 5 is shown producing the effective circular source 6 at a distance Q (see FIG. 3), from the entrance pupil lens, of 3.94 inches. Alternatively, within the scope of the present invention, the distance Q can be in the range between 3 to 4 inches to provide the desired submicron resolution at the mask wafer plane for different sized substrates. The effective circular source 6 forms an effective aperture stop or telecentric stop, without a mechanical stop and without the diffraction effects that such a stop might cause. For the embodiment in FIG. 1, the effective circular source 6 has a diameter of one (1) inch.

The radiation pattern 18 from the effective circular source 6 is directed to a dual filter assembly 8 to tune the system 1 to a chosen mercury resonance line for the elimination of chromatic aberration and consequent improvement in radiation pattern uniformity. The dual filter assembly 8 is optional, wherein the dual filter assembly 8 is retractable out of the path of the ray bundle 18 in a sliding manner. The dual filter assembly 8 consists of ultraviolet and heat absorbing filters, commercially available from Corning and Schott, which absorb approximately two thirds (⅔) of the infrared radiation (IR) impinging the dual filter assembly 8 and, thus, effectively reduce the radiation impinging on the photoresist layer 14 and protect the bandpass filters comprising the dual filter assembly 8. The dual filter assembly 8 has an optical bandwidth of ±40 nanometers centered about the system 1 resonant wavelength of 365 nanometers, and exhibiting a 50% attenuation of radiation at the bandwidth ends of 325 nanometers and 405 nanometers.

The quasi monochromatic ray bundle 19 emanating from the dual filter assembly 8 is collected by the entrance pupil lens 9 and directed to a larger collimation lens 10 resulting in the formation of a large bundle 21 of collimated rays. The entrance pupil lens 9 and collimation lens 10 are plano convex lenses oriented with their convex surfaces toward the longer conjugate to reduce spherical aberration and form a collimated beam 21 which is characterized by uniform and stable parallel ray distribution across the photomask 11 and therefore upon the wafer substrate surface 12. The entrance pupil lens 9 depicted in FIG. 1, is preferably made from BK7 type glass for NUV exposure with an overall lens diameter of 8 inches and an entrance pupil lens rim diameter E of 7.6 inches, a radius of curvature of 6.204 inches, and a refraction index of 1.5363. Likewise, the collimation lens 10 is preferably made from BK7 type glass for NUV exposure, has a lens diameter of 10 inches, a radius of curvature of 7.755 inches, and a refraction index of 1.5363.

The coherency factor for the system 1, which is spatial rather than temporal, is equal to the effective circular source 6 diameter divided by the entrance pupil lens 9 rim diameter E, which are 1 inch and 7.6 inches, respectively. The spatial coherency factor for the present optical system 1 design equals 0.13, which implies that the radiant source is eighty seven percent (87%) spatially coherent. The results of an increase in spatial coherence in the radiation source operate to provide improved resolution, image contrast, depth of focus, line width control, and latitude of exposure.

As shown in FIG. 1, all lenses are plano convex lenses fabricated from fused silicon glass for both NUV and DUV exposure. Their convex surfaces are oriented to the longer conjugate for minimized spherical aberration which results in improved collimation uniformity. The highly collimated and spatially coherent radiation beam can be used to irradiate a telecentric objective for projection exposure on wafer steppers or flood exposure systems.

Figure 2:
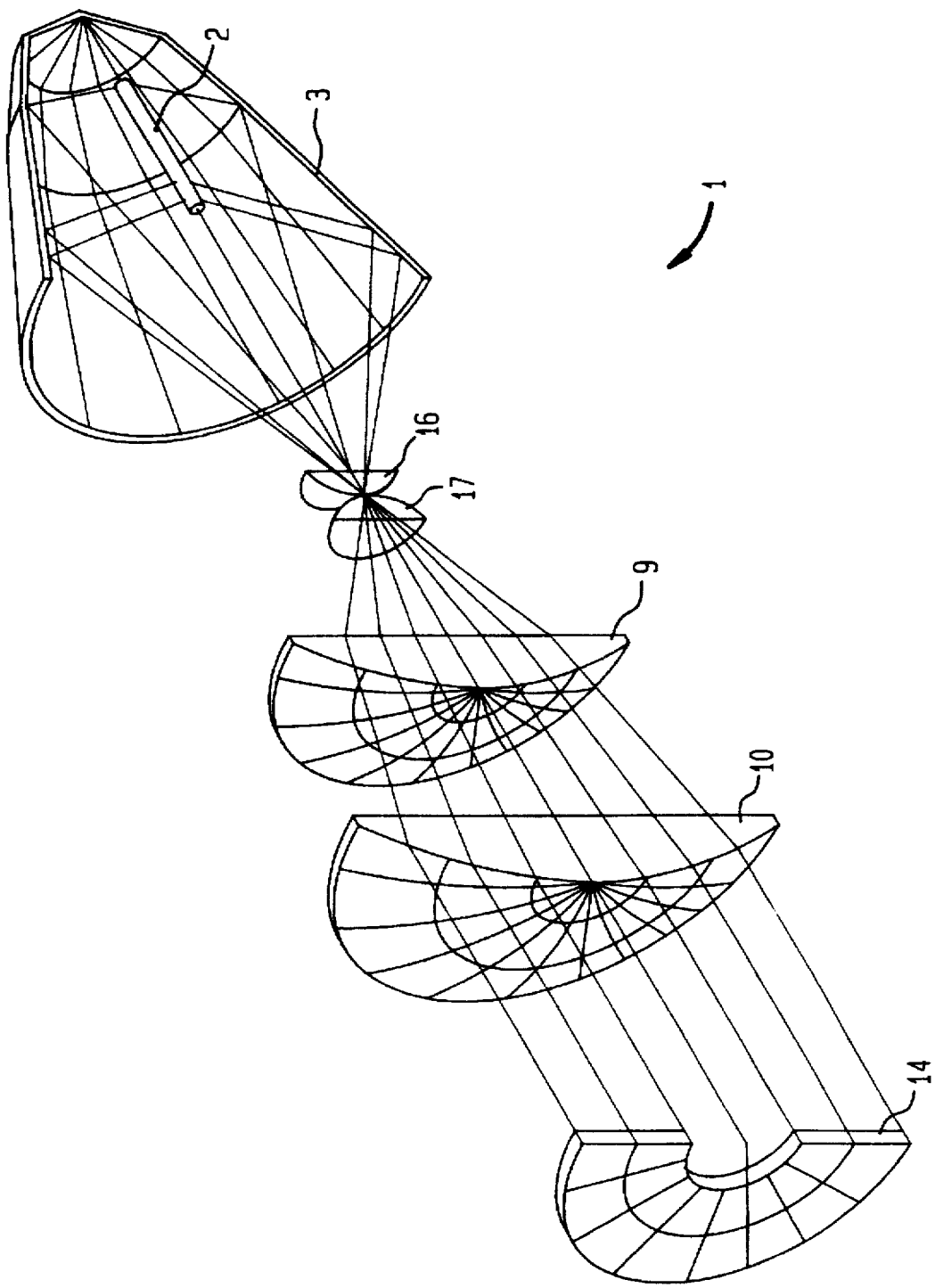
FIG. 2 is a perspective view of a longitudinal cut-out section of the irradiator depicted in FIG. 1 with ray tracing showing that the irradiator is telecentric.

Referring now to FIG. 2, there is shown a perspective view of a longitudinal cutout section of the irradiator depicted in FIG.1 with ray tracing showing that the irradiator 1 is telecentric. FIG. 2 demonstrates that the present system 1 is truly telecentric and the energy radiated from the long arc mercury lamp 2 is converted into a circular distribution of irradiance in the mask and wafer plane 14.

Figure 3:
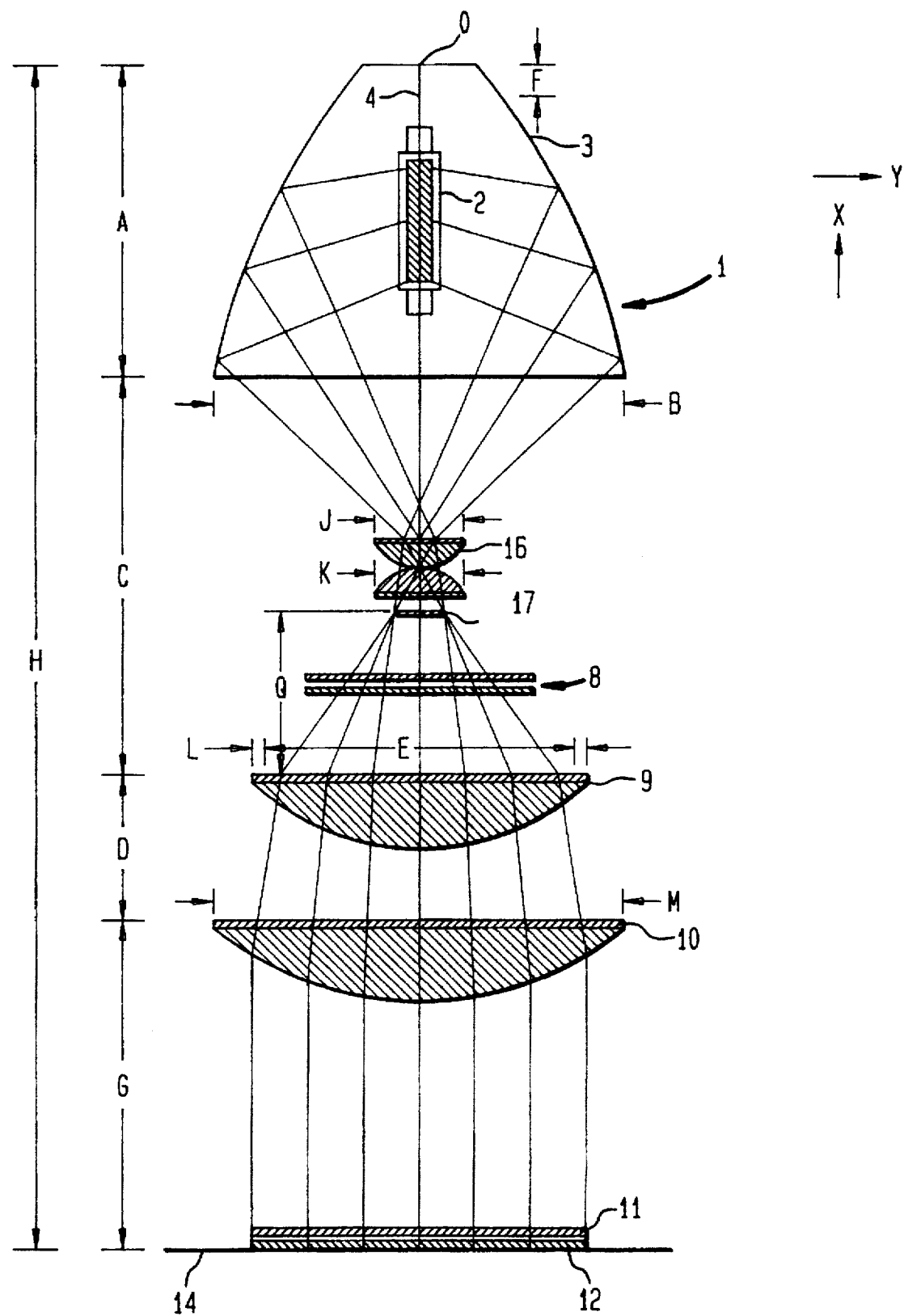
FIG. 3 is a schematic of the present irradiator of FIG. 1 with relative dimension references.

Referring now to FIG. 3, there is shown the schematic of FIG. 1 with additional references to dimensions for key components of the system I and dimensions relating key spatial relationships between the components. It is noted that FIGS. 1 and 3 are drawn to a scale of 4 to 1, whereby one inch in the Figures corresponds to four inches for the actual physical dimensions. Hence, the dimensions and separations of the various components as shown on FIGS. 1 and 2 are immediately ascertained by means of simple measuring instruments and accounting for the above noted scale reduction from physical to schematic dimensions.

In any event, the referenced separation dimensions in FIG. 3 are as follows: the distance f to the focal point F from the origin point O is 0.75 inches, the longitudinal length A along the optical axis 7 for the paraboloidal reflector is 7.45 inches, the diameter B of the paraboloidal reflector is 9.6 inches, the separation distance C between the paraboloidal reflector and the plano side of the entrance pupil lens 9 9.84 inches, the separation distance D, between the plano sides of the entrance and collimation lenses, 9 and 10, respectively, is 3.60 inches, the separation distance G between the plano side of the collimation lens 10 and the mask/wafer plane 14 is 8.80 inches, and the overall length H from the origin point O to the mask/wafer plane 14 is 29.7 inches. The lens dimensions are as follows: condenser lens 16 has a lens diameter J of 2 inches, condenser lens 17 has a lens diameter K of 2 inches, entrance pupil lens 9 has a rim diameter E of 7.6 inches and an overall lens diameter L of 8 inches, and the collimation lens 10 has an overall lens diameter M of 10 inches. The mask 11 and wafer 12 diameters shown are both 8 inches, with the mask 11 and wafer 12 spaced apart 10 micrometers.

It is apparent from the above, that the present invention provides improved submicron resolution, over the prior art, with an NUV-DUV radiant source for out of contact exposure of large substrates. In particular, the prior art Caprari '029, discloses an elongated arc mercury lamp providing UV radiation in the range between 200 to 300 nanometers, an ellipsoidal reflector with a relatively coarse scattered inner surface to account for the radiation irregularity from the elongated arc mercury lamp, a combination of lenses which provide a radiant source impinging on the photoresist layer that is 76% spatially coherent, and the capability of achieving submicron resolution for substrate diameter sizes up to five (5) inches. In contrast, the present invention teaches an optical system providing submicron resolution at the photoresist layer for substrate sizes beyond five inches, i.e., 8, 12, and 24 inches. The present invention discloses a system utilizing a long arc mercury lamp 2 providing more uniform radiation in a greater spectral region between 185–400 nanometers, a paraboloidal reflector 3 with a mirror like inner surface providing greater reflectivity, a condenser lens system providing an improved effective circular or image source 6 which is a true telecentric stop without the need for a mechanical stop and the diffraction effects it would cause, and a greatly improved spatial coherence factor of 0.13. Hence, the present invention provides, hereto before not attainable by the prior art, excellent critical dimension control and very high image contrast in the photoresist exposure.

It should be understood that the embodiment described herein is merely exemplary and that a person skilled in the art may make many variations and modifications to this embodiment utilizing functionally equivalent elements to those described herein. Any and all such variations or modifications as well as others which may become apparent to those skilled in the art, are intended to be included within the scope of the invention as defined by the appended claims.

I claim:

1. An optical system having a reflector for reradiating ultraviolet energy emitted by a mercury lamp as a radiation beam to a condenser lens assembly which directs the radiation beam through an entrance pupil lens and a collimation lens onto an intended plane distal from said mercury lamp, said system comprising:

said mercury lamp operating under a predetermined pressure and being an elongated arc having a length to width ratio greater than 2;

said reflector being a paraboloidal reflector responsive to said ultraviolet energy emitted by said mercury lamp to provide a converging radiation beam; and said condenser lens assembly responsive to said converging radiation beam to provide an effective circular source which operates as a telecentric stop of said optical system.

2. The optical system according to claim 1, where said predetermined pressure is between 0.5 to 5.0 atmospheres.

3. The optical system according to claim 1, wherein said ultraviolet radiation emitted by said mercury lamp is in the spectral region between 185–440 nanometers.

4. The optical system according to claim 1, further including a dual filter assembly positioned between said effective circular source and said entrance pupil lens, said dual filter assembly operative to reduce chromatic aberration.

5. The optical system according to claim 1, wherein said paraboloidal reflector has an inner surface providing a mirror reflectivity to said ultraviolet radiation emitted by said mercury lamp.

6. The optical system according to claim 5, wherein said inner surface is coated to provide said mirror reflectivity in the wavelength range from 185 nanometers to 440 nanometers.

7. The optical system according to claim 1, wherein said paraboloidal reflector surrounds said mercury lamp and said elongated arc of said mercury lamp is positioned below a focal point of said paraboloidal reflector.

8. The optical system according to claim 1, wherein said converging radiation beam provided is characterized by marginal irradiance greater than irradiance at the center of said converging radiation beam.

9. The optical system according to claim 1, wherein said condenser lens assembly includes first and second plano convex lenses, said first convex plano lens having its vertex facing the vertex of said second plano convex lens.

10. The optical system according to claim 9, wherein said first plano convex lens and said second plano convex lens cooperate to receive said converging radiation beam to create said effective circular source for providing predetermined marginal irradiance and compensate for cosine losses.

11. The optical system according to claim 1, wherein said entrance pupil lens is responsive to said effective circular source to provide an enlarged version of said effective circular source.

12. The optical system according to claim 11, wherein said collimation lens is responsive to said enlarged version of said effective circular source so as to direct a collimated beam from said collimation lens onto said intended plane.

13. An ultraviolet radiation source apparatus comprising:

a mercury arc lamp operating under a predetermined pressure for producing ultraviolet radiation and being an elongated arc having a predetermined length to width ratio;

a paraboloidal reflector cooperating with said mercury arc lamp to provide a converging ray bundle of said ultraviolet radiation;

a condenser lens assembly responsive to said converging ray bundle to provide an effective circular source; and means responsive to said effective circular source to direct a modified form of said effective circular source to a given target area at a given plane.

14. The apparatus according to claim 13, wherein said ultraviolet radiation is in the spectral region between 185 to 440 nanometers.

15. The apparatus according to claim 13, wherein said predetermined pressure is between 0.5 to 5.0 atmospheres.

16. The apparatus according to claim 13, wherein said predetermined length to width ratio is greater than two.

17. The apparatus according to claim 13, wherein said elongated arc of said mercury lamp is symmetrically surrounded by an inner surface of said paraboloidal reflector and positioned below the focal point of said paraboloidal reflector.

18. The apparatus according to claim 13, wherein said condenser lens assembly operates to focus said converging ray bundle into said effective circular source of predetermined diameter and higher marginal irradiance to compensate for marginal cosine losses.

19. The apparatus according to claim 18, wherein said condenser lens assembly includes first and second plano convex lenses with their vertices facing each other.

20. The apparatus according to claim 13, wherein said means responsive to said effective circular source includes an entrance pupil lens positioned with respect to said condenser lens assembly to receive said effective circular source and to provide an enlarged version of said effective circular source at an output of said entrance pupil lens and a collimation lens positioned with respect to said entrance pupil lens to receive said enlarged version to provide a collimated beam therefrom that is directed to an out-of-contact mask and wafer at said given plane to expose said wafer according to a mask pattern with said collimated beam.

21. The apparatus according to claim 13, further including a dual filter assembly positioned between said condenser lens assembly and said means responsive to said effective circular source, said dual filter assembly operative to reduce chromatic aberration in said ultraviolet radiation from said effective circular source.

22. An optical system for providing an ultraviolet radiation pattern for photolithography, comprising:
- a mercury lamp operating under a predetermined pressure for producing ultraviolet radiation and being an elongated arc of a given length to width ratio;
- a paraboloidal reflector symmetrically surrounding said mercury lamp below its focal point to efficiently collect the ultraviolet radiation from said mercury elongated arc lamp for generating a converging ray bundle with higher marginal irradiance than its center;
- a short focal length condenser lens assembly positioned with respect to said paraboloidal reflector to retrieve said converging ray bundle to provide at an output a predetermined diameter circular pattern indicative of an effective circular source; and
- an entrance pupil lens and a collimation lens positioned with respect to said condenser lens assembly to provide at an output a collimated beam of high uniformity and stability for projecting said collimated beam to a mask and wafer out-of-contact to each other and radiate such mask and wafer with said collimated beam.

23. The system according to claim 22, wherein said given length to width ratio is greater than 2.

24. The system according to claim 22, wherein said mercury lamp emits said ultraviolet radiation in the range between 185 to 440 nanometers.

25. The system according to claim 22, wherein said mercury lamp is pressurized between 0.5 to 5 atmospheres.

26. The system according to claim 22, wherein said paraboloidal reflector and said short focal length condenser lens assembly cooperate to generate said effective circular source characterized by high marginal irradiance to improve the uniformity at mask and wafer planes.

27. The system according to claim 22, wherein said short focal length condenser lens assembly comprises two short focal length plano convex lenses mounted with their vertices facing each other to increase collection efficiency and reduce spherical aberration.

28. The system according to claim 22, wherein said entrance pupil lens and said collimation lens are plano convex lenses oriented with their convex surfaces toward the longer conjugate to reduce spherical aberration.

29. The system according to claim 22, wherein the ratio of a effective circular source diameter to the diameter of said entrance pupil lens results in a spatial coherency factor not greater than 0.13.

30. The system according to claim 22, further including a dual filter assembly positioned between the condenser lens assembly and said entrance pupil lens, said dual filter assembly operative to reduce chromatic aberration.

* * * * *